United States Patent [19]
Maeda et al.

[11] Patent Number: 4,842,959
[45] Date of Patent: Jun. 27, 1989

[54] ALUMINUM ENAMEL BOARD

[75] Inventors: Ryu Maeda; Shingoro Fukuoka, both of Tokyo; Hiroshi Yatabe, Yokohama, all of Japan

[73] Assignee: The Furukawa Electric Co., Ltd., Tokyo, Japan

[21] Appl. No.: 107,944

[22] Filed: Oct. 13, 1987

[30] Foreign Application Priority Data

Oct. 17, 1986 [JP] Japan .................................. 159140[U]
Oct. 27, 1986 [JP] Japan ............................ 61-164810[U]
Feb. 5, 1987 [JP] Japan .............................. 62-25248[U]

[51] Int. Cl.$^4$ ......................... B32B 15/04; B32B 17/06
[52] U.S. Cl. ..................................... 428/630; 428/650; 428/653; 428/432; 428/901
[58] Field of Search ............... 428/630, 650, 653, 901, 428/432, 433

[56] References Cited

U.S. PATENT DOCUMENTS 3,586,614  6/1971  Boggs et al. ......................... 428/653

FOREIGN PATENT DOCUMENTS 0048992  4/1982  European Pat. Off. .
0139030  5/1985  European Pat. Off. .

OTHER PUBLICATIONS

Low Expansion Porcelain–Coated Copper–Clad Invar Substrates, K. W. Hang et al; RCA Review, vol. 45, Mar. 1984.
Optimization of RCA Porcelain for Compatibility with Thick Films, A. N. Prabhu et al., RCA Review, vol. 42, Jun. 1981.
Characterization of Thick Film Compositions on Porcelainized Steel Substrates; T. R. Allington, R. E. Cote, E. I. du Pont de Nemours & Co., Niagara Falls, NY Proc. 1978 int, Microel Symposium.
Denshi Zairyo (Electronics Material), May 1987.
Denshi Gijutsu (Electronics Technology), 1985/12 Extra edition.

*Primary Examiner*—L. Dewayne Rutledge
*Assistant Examiner*—George Wyszomierski
*Attorney, Agent, or Firm*—Frishauf, Holtz, Goodman & Woodward

[57] ABSTRACT

This invention provides an aluminum enamel board having an electrically insulating glass layer formed on an Al-Si alloy plate containing at least 5 wt % of Si or a composite metal plate having an aluminum or alloy layer formed on at least one side of a metal plate made of a metal other than aluminum. Since the Al-Si alloy plate containing at least 5 wt % of Si or a composite metal plate having the aluminum or aluminum alloy layer is used as a board, the adhesion strength between the metal plate and the electrically insulating glass layer can be increased. At the same time, a predetermined material is used to form the electrically insulating glass layer, thereby minimizing a difference in thermal conductivity and thermal expansion coefficient between the electrically insulating glass layer and the metal plate. This improves the heat conduction characteristics of the board and prevents warping of the board.

17 Claims, 1 Drawing Sheet

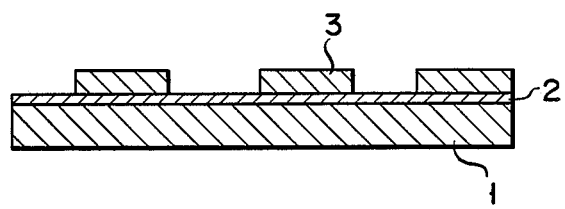
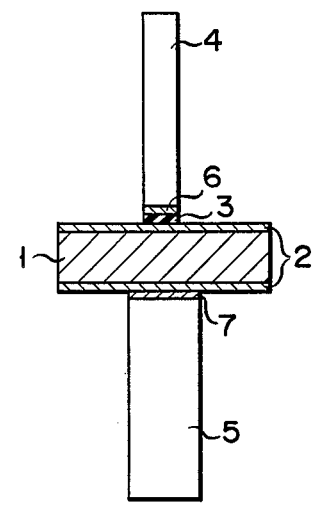
FIG. 1        FIG. 3
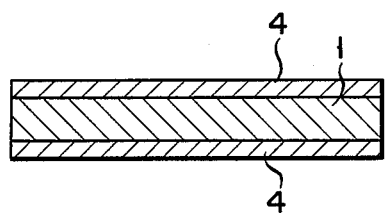
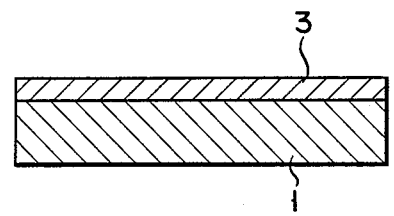
FIG. 2        FIG. 4

4,842,959

ALUMINUM ENAMEL BOARD

BACKGROUND OF THE INVENTION

The present invention relates to an aluminum enamel board used as a printed circuit board.

Ceramic and glass-epoxy electrically insulating boards have been popular as conventional printed circuit boards. In recent years, however, enamel boards having metal plates as cores have been developed. Enamel boards include an iron enamel board and a stainless steel enamel board. A conductive or resistive paste is printed and calcined on an electrically insulating glass layer formed on an iron or stainless steel board to prepare such an enamel board which is used as a hybrid IC. Large enamel boards can be easily manufactured although a large board cannot be manufactured using a ceramic electrically insulating board. The enamel boards have high resistance to mechanical impact and vibration and high thermal resistance.

Iron has a thermal conductivity of $50 \times 10^{-3}$ W/mk, while stainless steel has a thermal conductivity of $15 \times 10^{-3}$ W/mk. An iron or stainless steel enamel board has a thermal conductivity slightly higher than that of a ceramic board. Since an iron-based material generally does not have high adhesion strength with glass, an iron-based metal plate must be Ni-plated to form an enamel glass layer on the metal plate. In addition, an iron-based material has low corrosion resistance and low oxidation resistance, so that a glass layer must be undesirably coated on the entire surface of the iron-based metal plate.

An aluminum enamel board using aluminum as a core metal has also been developed. In the aluminum enamel board, the thermal conductivity of aluminum is as high as $240 \times 10^{-3}$ W/mk, the specific gravity thereof is as small as 2.7, and corrosion and oxidation resistance characteristics thereof are excellent. Aluminum can be advantageously oxidized to form a thin oxide film. Therefore, enamel glass can be easily formed thereon with high adhesion strength.

Although aluminum has a high thermal expansion coefficient of $24 \times 10^{-6}$, the thermal expansion coefficient of enamel glass is low and therefore the board becomes undesirably warped after enamel calcination is performed. In addition, since a difference between the thermal expansion coefficients of aluminum and enamel glass is large, the surface of the enamel glass layer forms cracks or irregular wrinkles upon calcination. When a board having a high thermal expansion coefficient is used as a printed circuit board, parts may be undesirably peeled from the board by heat cycles upon mounting of the parts. More specifically, the thermal expansion coefficient of aluminum is $24 \times 10^{-6}$, the thermal expansion coefficient of chip parts is $8 \times 10^{-6}$, and the thermal expansion coefficient of a silicon semiconductor element is $4 \times 10^{-6}$. Therefore, the thermal expansion coefficient of the parts is as small as ⅓ to 1/6 that of the aluminum board. For this reason, when the printed circuit board is subjected to thermal hysteresis in the range of a low temperature to a high temperature of 100 to 200° C., bonding portions between the parts and board crack to peel the parts therefrom. As a result, reliability of electronic parts is degraded. Since the thermal conductivity of the enamel layer is signficantly smaller than that of aluminum, heat conduction characteristics of the aluminum enamel board are essentially determined by the enamel layer. In order to improve heat dissipation of the board, the thermal conductivity of the enamel layer must be increased.

SUMMARY OF THE INVENTION

It is an object of the present invention to provide an aluminum enamel board wherein an electrically insulating glass layer is formed on an Al-Si alloy plate containing at least 5% of Si or a composite metal plate having an aluminum or aluminum alloy layer formed on at least one side of a plate of a metal other than aluminum.

The present invention provides an aluminum enamel board to be used as a printed circuit board having a hybrid IC formed by a plate on alumina ceramic or a circuit formed by etching a copper-plated board.

According to the aluminum enamel board of the present invention, in order to decrease thermal expansion of aluminum, electrically insulating glass layer 3 having a predetermined pattern is formed on Al-Si alloy plate 1 containing at least 5% of Si, as shown in FIG. 4, or a composite metal plate having aluminum layer or aluminum alloy layer 2 formed on at least one side of a plate 1 of a metal other than aluminum and having a small thermal expansion coefficient, as shown in FIG. 1.

A method of preparing an Al-Si alloy plate containing at least 5% of Si and used as a board according to the present invention will be described below. The Al-Si alloy plate is prepared such that Al and Si are mixed at a predetermined mixing ratio, and the resultant mixture is melted as a hemogeneous molten alloy and then cast in molds. During casting, a treatment for improving quality of a cast product is performed or a cooling rate is increased to prevent large Si crystal grains. Therefore, small Si grains are uniformly distributed. When an enamel glass paste is printed and calcined on an Al-Si alloy plate prepared as described above, an aluminum enamel board having a smooth surface can be desirable obtained. The resultant ingot is filleted and is hot- and cold-rolled to obtain a rolled plate having a thickness of 0.5 to 2 mm. In order to prepare a composite aluminum plate having such an Al-Si alloy plate, a predetermined Al alloy plate is bonded to the surface of the filleted ingot, the ends of the ingots are welded, and the resultant structure is hot- and cold-rolled to obtain a rolled composite material plate having a thickness of about 0.5 to 2 mm.

An Al-Si alloy plate must contain at least 5 wt % of Si. If the content of Si is less than 5 wt %, the thermal expansion coefficient cannot be sufficiently lowered. Even if electrically insulating glass layer 3 is formed on an Al-Si alloy plate, board warping and peeling of glass layer 3 cannot be satisfactory eliminated.

However, if the content of Si exceeds 12 wt % although the upper limit is not specified, it is difficult to roll the alloy because an Si crystal grain size is excessively increased. When such a material is rolled, many pores may be formed on the surface because large Si grains are removed from the surface. In this state, when an enamel glass paste is printed and calcined on the porous surface, the paste is expanded at pore portions, resulting in many problems. For example, it is difficult to obtain a board having a smooth surface. If an Al-Si alloy plate containing 12 wt % or more of Si is used, an Al plate or an Al alloy plate having a composition different from that of the Al-Si alloy plate is applied as cladding layer 4 on metal plate 1 of an Al-Si alloy, thereby obtaining a composite aluminum plate, as shown in FIG. 2. In this case, it is most preferable to clad pure aluminum. A glass paste is printed and calcined on cladding layer 4 to form electrically insulating glass layer 3, thereby preparing an aluminum enamel board.

The ratio of the thickness (if cladding layers are respective formed on the upper and lower surfaces, the thickness must be a total thickness of the cladding layers) of cladding layer 4 to that of the composite aluminum plate (to be referred to as a cladding ratio hereinafter) preferably falls within the range of 0.2% to 10%. If the ratio is less than the value corresponding to 0.2%, crystal defects such as pinholes cannot be completely eliminated. However, if the ratio exceeds the value corresponding to 10%, the thermal expansion coefficient cannot be satisfactory decreased.

In order to form aluminum layer 2 on metal plate 1 of a metal other than aluminum (to be referred to as "metal plate 1" hereinafter) in a composite metal plate used as a board according to the present invention, the following methods can be utilized: a molten aluminum plating in which metal plate 1 is dipped in molten aluminum and is removed therefrom and rolled; a method in which direct chemical plating is performed for a metal plate by usig a non-aqueous aluminum solution; a cladding method in which a thin aluminum plate is pressed on metal plate 1 and these plates are mechanically bonded by rolling; a method in which a thin aluminum plate is pressed on metal plate 1, and the resultant structure is heated to bond them by diffusion or by forming a reactive phase; a physical deposition method such as vacuum deposition, sputtering, and ion plating; a chemical deposition method; and fire spraying. An optimal method can be employed according to the type of metal plate 1.

Aluminum layer 2 according to the present invention may be made of pure aluminum or an aluminum alloy. The thickness of aluminum layer 2 is not limited to a specific value but preferably falls within the range of 0.3 mm or less. However, aluminum layer 2 may be a thin film having a thickness of 1 μm or less.

Examples of metal plate 1, other than an aluminum plate, in the composite metal plate according to the present invention are metal plate 1 of Fe, Ni, Cu, W, Mo, or Si, an alloy plate of at least two of these metal elements, and a composite material plate of at least two of the metal elements and alloys which are prepared as described above. The composite materials are defiend as a Cu-W composite material prepared by a W or Mo plate impregnated with molten Cu, a Cu-Mo composite material, a composite material prepared by coating Cu on an Fe-Ni alloy plate, and a composite material prepared by coating an Fe-Ni alloy on a Cu plate.

Metal plate 1 of an Fe-Ni alloy plate, a W plate, an Mo plate, an Si plate, or a plate of a composite material of Cu and one of the above-mentioned metals as a major constituent has a thermal expansion coefficient similar to that of a semiconductor element mounted on a printed circuit board and is suitable for great improvement in electrical reliability of an electronic unit in heat cycles.

An enamel glass paste is applied by printing, spraying or the like to the resultant Al-Si alloy plate or composite metal plate having an aluminum or aluminum alloy layer formed on at least one side of a plate of a metal other than aluminum. The enamel glass paste is then calcined to form electrically insulating glass layer 3, thereby preparing an aluminum enamel board.

Electrically insulating glass layer 3 according to the present invention need not be formed by a ceramic material, but can be formed by a combination of a ceramic material and a metal powder or a combination of a ceramic material and a surface-oxidized metal powder. As a result, thermal expansion of the enamel layer can be increased to decrease a difference between the thermal expansion coefficients of aluminum and enamel glass.

The thermal conductivity of an aluminum plate or an aluminum alloy plate is high, while the thermal conductivity of the enamel layer is much lower than that of aluminum. For this reason, heat conduction characteristics of the aluminum enamel board are determined by the enamel layer. Therefore, it is important to increase heat conductivity of the enamel layer in order to improve heat dissipation of the board. From this point of view, a composite ceramic layer with a metal having a high thermal conductivity is formed on a metal plate.

A ceramic material used in the present invention is not limited to any specific one. A preferable ceramic material is prepared by adding an oxide to a glass powder containing $PbO-B_2O_3-SiO_2$ or $ZnO-B_2O_3-SiO_2$ as a major constituent and has a softening point of 400° to 600° C. A homogeneous molten ceramic material is cooled and solidified, or components constituting the ceramic material are mixed. The prepared material is pulverized by a ball mill or the like to prepare a fine powder having a grain size of several microns. The fine ceramic powder and a metal powder are kneaded with an organic vehicle prepared by mixing high boiling alcohol and ethyl cellulose to prepare a coating material. The coating material is applied to the surface of the aluminum plate by screen printing and is calcined at a temperature of 400° C. or more, thereby preparing the aluminum enamel board of the present invention. The metal powder is an aluminum powder, an aluminum alloy powder, or a surface-oxidized aluminum powder. The aluminum powder may be a spherical or flake-like powder and has a grain size of 1 to 10 microns, and preferably 5 to 15 microns. The content of the aluminum powder with respect to the ceramic material is 5 to 50 vol %, and preferably 10 to 20 vol %. If the content is less than 5 vol %, thermal conductivity is low and warping still occurs. However, if the content exceeds 50 vol %, the surface of the enamel board becomes nonuniform. The present inventors found that an enamel layer of the enamel board was preferably a composite material ceramic layer prepared by mixing a ceramic material and an aluminum powder. However, the material mixed with the ceramic material is not limited to aluminum, but can be replaced with a Ti, Mg, or Pb powder.

A method of forming electrically insulating glass layer 3 on aluminum layer 2 according to the present invention is not limited to a specific one. For example, a glass frit of $PbO-B_2O_3-SiO_2$ or $ZnO-B_2O_3-SiO_2$ is formed into a paste and the paste is applied to aluminum layer 2 by printing or spraying and is calcined in air at a temperature of 500° to 600° C. A ceramic powder such as an $Al_2O_3$ or AlN powder may be contained in glass layer 3 in order to improve thermal conductivity.

Brief Description of the Drawings

FIG. 1 is a sectional view showing a structure of an aluminum enamel board according to an embodiment of the present invention;

FIG. 2 is a sectional view of an aluminum enamel board composite metal plate having a cladding layer of aluminum or an aluminum alloy formed on a metal plate;

FIG. 3 is a sectional view showing a sample subjected to adhesion strength measurement in Example 1 of the present invention; and FIG. 4 is a sectional view of an aluminum enamel board of Example 5 using an Al-Si alloy plate.

DETAILED DESCRIPTION OF THE PREFERRED EMBODIMENTS

The present invention will be described by way of its examples and comparative examples.

EXAMPLE 1

0.05-mm thick aluminum films were formed on both sides of a 1.0-mm thick Cu alloy plate containing 1 wt % of Be according to the cladding method to prepare an Al-coated Cu alloy plate. A glass paste of $PbO-B_2O_3-SiO_2$ was applied on the Al-coated Cu alloy plate and was calcined at 600° C., and 100-$\mu$m thick electrically insulating glass layers having a thermal expansion coefficient of $14 \times 10^{-6}$/°C. were formed on both sides of the calcined body, thereby preparing a circuit board.

In order to evaluate the adhesion strength of the glass layers on the board, a 200-g copper ball was dropped from a height of 45 cm on the glass layer to check peeling of the glass layers according to an adhesion strength test complying with JIS R4301 (5.5). The surface of the aluminum layer was not exposed at all.

In order to measure the adhesion between the glass layers and the aluminum layer, the glass paste was screen-printed on the Al-coated Cu alloy plate prepared as in the above method and was calcined at 600° C. to prepare a 100-$\mu$m glass layer having a diameter of 5 mm. The resultant glass layer served as a specimen subjected to adhesion strength measurement. As shown in FIG. 3, aluminum layers 2 were respectively fomred on both surfaces of metal plate 1 and electrically insulating glass layer 3 as the specimen was formed on one of aluminum layers 2. 3-cm long alumina rod 4 having a diameter of 5 mm was bonded to glass layer 3 through low melting glass 6 having a softening point of 350° C. Alumina rod 5 was bonded to aluminum layer 2 through epoxy resin adhesive 7, thus preparing a test sample. The adhesion strength of glass layer 3 was measured to be 5.8 kg/mm$^2$ (n=5).

EXAMPLE 2

A 100-$\mu$m thick glass layer of $PbO-B_2O_3-SiO_2$ having a thermal expansion coefficient of $11 \times 10^{-6}$/°C. was formed on one of the surfaces of a 1.0-mm thick Al-coated iron plate having 100-$\mu$m thick Si-containing (8 wt %) Al alloy layers formed on an iron plate by plating with a molten aluminum alloy to prepare a circuit board, following the same procedures as in Example 1. An adhesion strength test by dropping a copper ball was performed following the same procedures as in Example 1. The surface of the aluminum layer was not exposed at all.

Another Al-coated iron plate was prepared following the same procedures as described above and a test sample was formed following the same procedures as in Example 1. The adhesion strength of the glass layer was measured to be 5.2 kg/mm$^2$ (n=5).

EXAMPLE 3

Pure aluminum was cladded on both surfaces of an Fe-Ni alloy plate having a thickness of 1.0 mm and containing 42 wt % of Ni to prepare an Al-coated Fe-Ni alloy plate coated with 0.05-mm thick aluminum layers. A glass paste of $PbO-B_2O_3-SiO_2$ was applied to the Al-coated Fe-Ni alloy plate and was calcined at 600° C. to form 100-$\mu$m thick electrically insulating glass layers having a thermal expansion coefficient of $4.1 \times 10^{-6}$/°C., thereby preparing a circuit board. An adhesion strength test was performed by dropping a copper ball, following the same procedures as in Example 1. The surface of the aluminum layer was not exposed at all.

Another Al-coated Fe-Ni alloy plate was prepared following the same procedures as described above and a test sample was formed following the same procedures as in Example 1. The adhesion strength of the glass layer was measured to be 6.1 kg/mm$^2$ (n=5).

EXAMPLE 4

An Al layer was spattered on one side of a composite material plate prepared by forming 0.1-mm thick Cu layers on both sides of a 0.8-mm thick Fe-Ni alloy plate (invar alloy) containing 36 wt % of Ni. A 100-$\mu$m thick glass layer having the same composition as in Example 3 was formed on the resultant aluminum layer and was calcined (in an $N_2$ gas containing 10 ppm of $O_2$) to prepare a circuit board. An adhesion test by dropping a copper ball was performed for the resultant circuit board, following the same procedures as in Example 1. The surface of the aluminum layer was not exposed at all. The adhesion strength of the glass layer was 5.4 kg/mm$^2$ (n=5).

COMPARATIVE EXAMPLES 1-4

A glass paste as in Examples 1 to 4 was applied to metal plates (without aluminum layers) used as boards in Examples 1 to 4 to form glass layers, and the adhesion strength of these glass layers was evaluated. The glass paste was calcined in an $N_2$ gas atmosphere containing 20 ppm of $O_2$ in order to prevent oxidation of the metal plates. Evaluation results are summarized in Table 1. An adhesion test by dropping a copper ball was performed, and the glass layers peeled from all samples in Comparative Examples 1 to 4.

TABLE 1

|  | Metal Plate | Adhesion Strength (kg/mm$^2$) |
| --- | --- | --- |
| Comparative Example 1 | Same as in Example 1 | 0.5 |
| Comparative Example 2 | Same as in Example 2 | 0.8 |
| Comparative Example 3 | Same as in Example 3 | 2.1 |
| Comparative Example 4 | Same as in Example 4 | 0.5 |

The following effects of the present invention are derived from Examples 1 to 4 and Comparative Examples 1 to 4. Since an aluminum layer is formed on the surface of a metal plate serving as a core or base in the aluminum enamel board of the present invention, the aluminum layer can be tightly bonded to a glass layer serving as an electrically insulating layer. Therefore, the aluminum enamel board can be effectively used as a hybrid IC circuit board. In addition, when a metal plate having a low thermal expansion coefficient is used as a core or base, semiconductor elements can be directly mounted on the board. Therefore, the packing density of the parts can be increased.

Examples 5 and 5 and Comparative Examples 5, which use Al-Si alloy plates as boards, will be described below.

Example 5

Al and an Al-Si alloy were mixed, melted and cast to prepare an Al-10 wt %Si alloy, and the resultant alloy ingot was hot- and cold-rolled to form 1.5-mm Al-Si alloy plate 1. This plate had a thermal expansion coefficient of $20.5 \times 10^{-6}$/K and was cut into square pieces each having a side of 50 mm. These pieces were cleaned using ultrasonic waves. An aluminum enamel glass frit available from Nippon Ferro Co. was pulverized to obtain a powder having a mean grain size of 1.5 μm. The powder was then dispersed in water, and the resultant dispersion was sprayed and dried on the surface of each piece. The spraying/drying cycle was repeated to set the thickness of the dried glass layer to be 300 μm. The piece with the glass layer was calcined in a furnace at 550° C. to prepare an aluminum enamel board having 150μm thick electrically insulating glass layer 3 (FIG. 4). No cracks or wrinkles were found on the surface of the aluminum enamel board. The glasslayer had a thermal expansion coefficient of $15 \times 10^{-6}$/K.

EXAMPLE 6

Al and an Al-Si alloy were mixed, melted and cast to prepare an Al-18%Si alloy plate, and the plate was cut into pieces. A pure Al plate was made to adhere to the surface of each piece, and the resultant structure was hot- and cold-rolled to prepare a 1.5-mm thick cladding material (FIG. 2) having Al-18%Si layers having a cladding ratio of 5% and formed on both surfaces. The cladding material had a thermal expansion coefficient of $19.0 \times 10^{-6}$/K. This plate was further cut into square pieces each having a side of 50 mm, and the pieces were cleaned using ultrasonic waves. An aluminum enamel board was prepared following the same procedures as in Example 5.

No wrinkles nor cracks were found on the surface of the aluminum enamel board.

COMPARATIVE EXAMPLE 5

A 1.5-mm thick Al plate having a side of 50 mm and an Al-2wt %Si alloy plate having the same dimensions as those of the Al plate were prepared following the same procedures as in Example 5. The Al plate had a thermal expansion coefficient of $25.0 \times 10^{-6}$/K, while the Al-2wt %Si alloy plate had a thermal expansion coefficient of $23.2 \times 10^{-6}$/K. Following the same procedures as in Example 5, 150-μm thick electrically insulating glass layers were respectively formed on these plates to prepare aluminum enamel boards. Wrinkles were formed on these boards, and the boards were also greatly warped.

The following effects of the present invention can be derived from Examples 5 and 6 and Comparative Example 5. Since at least 5 wt % of Si are added to aluminum as the metal plate of the conventional aluminum enamel board, the aluminum enamel board of the present invention can have a low thermal expansion coefficient which is similar to that of the electrically insulating glass layer, thereby preventing warping of the board and peeling of the electrically insulating glass layer. When the content of Si is increased in the Al-Si layer, the surface of the Al-Si alloy plate cannot be smooth. As a result, even if an enamel glass paste is printed and calcined on the Al-Si alloy paste, the resultant aluminum enamel board does not have a smooth surface.

This problem can be solved by cladding the Al-Si alloy plate with a pure aluminum. Since a thermal expansion coefficient of the overall board can be decreased, many problems encountered upon soldering of elements on the board can be solved.

Examples 7, 8, and 9 and Comparative Example 6 will be described in which a metal plate material is selected from W, Mo, Si, and a composite material of Cu and one of these metals as a major constituent.

EXAMPLE 7

Glass having a composition of 20wt %PBO-30wt %SiO$_2$10wt %B$_2$O$_3$—20wt %Na$_2$O—20wt %TiO$_2$ was mixed with ethyl alcohol, and the resultant mixture was pulverized by a ball mill to prepare a glass powder having a mean grain size of 2.0 μm. Spherical pure aluminum powder having a mean grain size of 7.0 μm was kept at 500° C. for 36 hours to oxidize the surface layer of the powder to a depth of 0.5 m. 20 vol % of the surface-oxidized aluminum powder were added to the above glass powder, ethyl cellulose and butyl Carbitol were mixed, and the resultant mixture was sufficiently kneaded by a triple roll mill, thereby preparing an aluminum powder-containing glass paste. An Al-10wt %Si alloy plate having a thickness of 1.5 mm, a width of 100 mm, and a length of 100 mm was sufficiently cleaned, and the aluminum powder-containing glass paste was applied to the aluminum plate by screen printing. The resultant structure was dried at 100° C. for 30 minutes and was calcined in air at 530° C.

The above cycle was repeated to prepare an aluminum enamel board having 100-μm thick enamel layers. The board had a thermal conductivity of 170 W/mk, and warping was measured to be 0.2 mm/100 mm. The board also had a breakdown voltage of 1.2 kV/mm, and a resistivity of $3.5 \times 10^{12}$ Ωcm.

EXAMPLE 8

An aluminum powder which was not surface-oxidized was mixed with glass to prepare a paste and hence an enamel board, following the same procedures as in Example 7. Since the surface of the aluminum powder was not oxidized, the paste reacted slightly with ethyl cellulose and butyl Carbitol and did not have an appropriate viscosity. For this reason, the resultant enamel board, prepared such that the paste was applied by screen printing to an Al-Si alloy plate as in Example 7, dried at 100° C. for 30 minutes, and calcined in air at 530° C., did not have a smooth surface. The enamel board had a thermal conductivity of 175 W/mk, and its warping was measured to be 0.2 mm/100 mm. The board had a breakdown voltage of 6 kV/mm and a resistivity of $1.3 \times 10^{11}$ Ωcm.

EXAMPLE 9

15 vol % of a stainless steel powder subjected to 2-hour surface oxidation at 1,250° C. and having a mean grain size of 10 μm was mixed with glass used as in Example 7, and ethyl cellulose and butyl Carbitol were added thereto. The resultant mixture was sufficiently kneaded by a triple roll mill to prepare a stainless steel powder-containing glass paste. An Al-10wt %Si alloy plate having a thickness of 1.5 mm, a width of 100 mm, and a length of 100 mm was sufficiently cleaned, and the stainless steel powder-containing glass paste was applied to the aluminum plate by screen printing. The resultant structure was dried at 100° C. for 30 minutes and was calcined in air at 530° C.

The above cycle was repeated to prepare an aluminum enamel board having 100-μm thick enamel layers. The board had a thermal conductivity of 120 W/mk, and warping was measured to be 0.25 mm/100 mm. The board also had a breakdown voltage of 1.5 kV/mm, and a resistivity of $4.1 \times 10^{12}$ μm.

COMPARATIVE EXAMPLE 6

A glass paste which did not contain an aluminum powder was prepared following the same procedures as in Example 7 and was calcined on an aluminum plate having a thickness of 1.5 mm, a width of 100 mm, and a length of 100 mm to prepare an aluminum enamel board having a 100-μm enamel layer of only glass. The enamel board had a thermal conductivity of 95 W/mk, and its warping was measured to be 1.2 mm/100 mm. The enamel board had a breakdown voltage of 1.2 kV/mm and a resistivity of $4.5 \times 10^{12}$ μm.

The following effects of the present invention can be derived from Examples 7, 8, and 9 and Comparative Example 6. Since the enamel layer of the aluminum enamel board of the present invention comprises a composite ceramic material of ceramic and a metal powder, the thermal conductivity and the thermal expansion coefficient of the enamel layer can be similar to those of the aluminum core. Therefore, there is provided an aluminum enamel board free from warping and having good heat conduction characteristics. Therefore, unlike in the conventional circuit board, the packing density of electronic parts which generate heat can be increased.

What is claimed is:

1. An aluminum enamel board for printed circuits, comprising a base plate and an electrically insulating glass layer on said base plate, said base plate being selected from the group consisting of an Al-Si alloy plate containing at least 5% of Si, and a composite metal plate consisting of a metal plate and an Al or Al alloy layer formed on said metal plate such that said Al or Al alloy layer is interposed between said metal plate and said insulating glass layer, and said metal plate consists essentially of a material selected from the group consisting of an Al-Si alloy containing at least 5% of Si, an Fe-Ni alloy containing at least 36% Ni, W, Mo, Si and combination of Cu and any one of W, Mo and Si.

2. The board according to claim 1, wherein the metal plate is said Al-Si alloy plate containing at least 5 wt % of Si.

3. The board according to claim 1, wherein the aluminum or aluminum alloy layer is clad to said composite metal plate.

4. The board according to claim 1, wherein the base plate is said composite metal plate consisting of a metal plate and an Al or Al alloy layer formed on said metal plate such that said Al or Al alloy layer is interposed between said metal plate and said insulating glass layer, and said metal plate consists essentially of a material selected from the group consisting of an Al-Si containing at least 5% of Si, an Fe-Ni alloy containing at least 36% Ni, W, Mo, Si and combination of Cu and any one of W, Mo and Si.

5. The board according to claim 8 wherein said metal plate consists essentially of said Al-Si alloy containing at least 5% of Si.

6. The board according to claim 4 wherein said metal plate consists essentially of said Fe-Ni alloy and said Fe-Ni alloy contains 36%–42% Ni.

7. The board according to claim 4 wherein said metal plate consists essentially of W.

8. The board according to claim 4 wherein said metal plate consists essentially of Mo.

9. The board according to claim 4 wherein said metal plate consists essentially of Si.

10. The board according to claim 4 wherein said metal plate consists essentially of said combination of Cu and W.

11. The board according to claim 4 wherein said metal plate consists essentially of said combination of Cu and Mo.

12. The board according to claim 4 wherein said metal plate consists essentially of said combination of Cu and Si.

13. An aluminum enamel board for printed circuits, comprising a base plate and an electrically insulating glass layer which comprises a ceramic material and a metal powder on said base plate, said base plate being selected from the group consisting of an Al-Si alloy plate containing at least 5% of Si, and a composite metal plate consisting of a metal plate and an Al or Al alloy layer formed on said metal plate such that said Al or Al alloy layer is interposed between said metal plate and said insulating glass layer, and said metal plate consists essentially of a material selected from the group consisting of an Al-Si alloy containing at least 5% of Si, an Fe-Ni alloy, W, Mo, Si and combination of Cu and any one of W, Mo and Si.

14. The board according to claim 13, wherein the metal powder is a material selected from the group consisting of an aluminum powder, an aluminum alloy powder, a surface-oxidized aluminum powder, and a surface-oxidized aluminum alloy powder.

15. The board according to claim 13, wherein the electrically insulating glass layer has a composition of 5 to 50 vol % of the metal powder with respect to the ceramic material.

16. An aluminum enamel board for printed circuits, comprising a base plate and an electrically insulating $PbO-B_2O_3-SiO_2$ glass layer on said base plate, said base plate being selected from the group consisting of an Al-Si alloy plate containing at least 5% of Si, and a composite metal plate consisting of a metal plate and an Al or Al alloy layer formed on said metal plate such that said Al or Al alloy layer is interposed between said metal plate and said insulating glass layer, and said metal plate consists essentially of a material selected from the group consisting of an Al-Si alloy containing at least 5% of Si, and Fe-Ni alloy, W, Mo, Si and combination of Cu and any one of W, Mo and Si.

17. An aluminum enamel board for printed circuits, comprising a base plate and an electrically insulating $ZnO-B_2O_3-SiO_2$ glass layer on said base plate, said base plate being selected from the group consisting of an Al-Si alloy plate containing at least 5% of Si, and a composite metal plate consisting of a metal plate and an Al or Al alloy layer formed on said metal plate such that said Al or Al alloy layer is interposed between said metal plate and said insulating glass layer, and said metal plate consists essentially of a material selected from the group consisting of an Al-Si alloy containing at least 5% of Si, and Fe-Ni alloy, W, Mo, Si and combination of Cu and any one of W, Mo and Si.

* * * * *

UNITED STATES PATENT AND TRADEMARK OFFICE
CERTIFICATE OF CORRECTION

PATENT NO. : 4,842,959
DATED : June 27, 1989
INVENTOR(S) : MAEDA et al

It is certified that error appears in the above-identified patent and that said Letters Patent is hereby corrected as shown below:

In the title page, under "Foreign Application Priority Data", the first application number "159140[U]" should read --61-159140[U]--.

Signed and Sealed this

Fourteenth Day of August, 1990

Attest:

HARRY F. MANBECK, JR.

*Attesting Officer*      *Commissioner of Patents and Trademarks*